United States Patent [19]

Fichot et al.

[11] 4,249,034
[45] Feb. 3, 1981

[54] SEMICONDUCTOR PACKAGE HAVING STRENGTHENING AND SEALING UPPER CHAMBER

[75] Inventors: Julie Y. Fichot, Skaneateles; Alfred Roesch, Auburn, both of N.Y.

[73] Assignee: General Electric Company, Auburn, N.Y.

[21] Appl. No.: 963,807

[22] Filed: Nov. 27, 1978

[51] Int. Cl.³ .............................................. H05K 7/20
[52] U.S. Cl. ............................ 174/52 H; 174/17.05; 357/72; 361/386
[58] Field of Search ...................... 357/72, 74, 75, 81; 174/17.05, 17.07, 17.08, 525, 52 H, 52 PE; 361/380–382, 386–388

[56] References Cited

U.S. PATENT DOCUMENTS

| | | | |
|---|---|---|---|
| 3,217,213 | 11/1965 | Slater | 174/52 H |
| 3,237,063 | 2/1966 | Keller | 174/17.07 |
| 3,268,309 | 8/1966 | Frank | 174/52H |
| 3,293,510 | 12/1966 | Pfaffenberger | 174/52 H |
| 3,311,798 | 3/1967 | Gray | 174/52 H |
| 3,717,523 | 2/1973 | Dunsche | 357/72 |
| 3,769,560 | 10/1973 | Miyake | 174/52 H |
| 3,904,939 | 9/1975 | Carino | 174/52 S |

Primary Examiner—Gerald P. Tolin
Attorney, Agent, or Firm—Robert J. Mooney; Stephen B. Salai

[57] ABSTRACT

A semiconductor device is described wherein a semiconductor pellet is disposed within a hermetically sealed chamber including a thermally conductive base and a substantially rigid housing, said housing including an open upper chamber in which are disposed electrical terminals and which is filled with a sealing and strengthening layer to substantially increase the strength and hermeticity of the package.

15 Claims, 6 Drawing Figures

SEMICONDUCTOR PACKAGE HAVING STRENGTHENING AND SEALING UPPER CHAMBER

This invention relates in general to packages for semiconductor devices and more particularly to a package for relatively high power semiconductor devices which includes a chamber surrounding the semiconductor element which chamber is filled with a controlled ambient environment.

As semiconductor devices become increasingly pervasive in a wide variety of applications, there is a need for advanced packaging techniques. Many of the characteristics of state-of-the art semiconductor devices are determined or limited by packaging considerations. Present day semiconductor devices commonly include one or more semiconductor elements. These elements, often very small semiconductor chips or pellets, are themselves somewhat fragile, single crystal bodies. They are sensitive to their environment and require electrical and thermal connections for applying electrical signals and for removing heat. A great variety of packages for such semiconductor elements is known to those skilled in the art. Such packages range from the extremely low cost and simple type of package including only a ceramic plate having a simple metal pattern thereon and a semiconductor element mounted to the metal pattern, as exemplified by the SUBSCRETE® semiconductor devices manufactured by General Electric Company, to the massive and complex packages which house extremely high voltage, high current semiconductor devices.

Certain packaging requirements transcend a wide range of particular classes of devices. The semiconductor elements must be physically supported in order to withstand physical stresses. The semiconductor element must be, according to the application, protected from contamination by its operating environment. The package must be sufficiently strong to withstand external abuse. The package must provide sufficient heat removal capability for stable operation of the device over the temperature range in which it must operate. The package must protect the device during thermal cycling which results from the environment of operation, or due to heating of the device itself during operation. The package itself must not contribute dangerous failure modes to a device, such as explosion.

Typically, semiconductor devices have been manufactured by mounting a semiconductor element on a heatsink, attaching one or more leads to the element; the heatsink itself in some cases serving as an electrical connection and encapsulating the element and at least a portion of the leads and heatsink in an environmentally impervious material. This type of package has provided satisfactory results in a wide range of applications, but it is subject to some or all of the disadvantages hereinabove enumerated. The coefficient of thermal expansion of the encapsulating material is frequently different from that of the semiconductor element thus introducing physical stresses as the device is heated and cooled. Should the device fail, for example, by rapid differential expansion of the semiconductor element or by any of the interfaces bonding it to the heatsink, the encapsulant may shatter or fracture. Depending upon the nature of the encapsulant, contamination of the pellet under certain operating conditions may be a problem.

It is the object of this invention to provide a new and improved semiconductor package suitable for housing both single semiconductor elements and multi-element assemblies which package obviates all the problems thus far described.

It is a feature of a semiconductor package in accordance with this invention that it introduces extremely low stresses on the semiconductor element due to the package itself.

It is another feature of this invention that contamination of the semiconductor element by the package material is virtually eliminated.

It is another feature of this invention that a physically strong package is provided with the aforesaid low stress on the semiconductor element.

It is another feature of this invention that especially good temperature stability and resistance to temperature cycling is provided.

It is another feature of this invention that improved blocking stability of a semiconductor element may be expected when utilizing a package as herein described.

It is still another feature of this invention that stress on the semiconductor element during the packaging process is virtually eliminated.

Briefly stated, and in accordance with one aspect of the present invention, a semiconductor package is provided which includes a base member which may conveniently be a heatsink member upon which a semiconductor element is mounted. The base member may be electrically conductive or insulative, and the semiconductor element may be mounted thereto either in ohmic contact or in thermal contact and electrically isolated therefrom. An electrically insulative enclosure cooperates with said base member to form a hermetically sealed chamber enclosing said semiconductor element or elements. The insulative enclosure may conveniently be fastened to the base member by an adhesive, or otherwise, to provide the desired degree of sealing. The insulative enclosure includes a recessed well portion separated from the chamber enclosing the semiconductor element or elements by a first partition. One or more electrical terminals extend through the partition to contact the electrical element and, where desired, the heatsink. Also extending through the housing is at least one tube, or the like, for evacuating the chamber and for refilling the chamber with a controlled ambient environment. It is a feature of this invention that the tube may sometimes be combined with one of the electrical connections through the partition. The open well which surrounds the aforesaid electrical connections is filled with a sealing material which both, adds to the mechanical strength of the package of this invention and provides sealing of the partition to insure the leak-tight character of the chamber including the semiconductor elements.

This invention contemplates a variety of semiconductor packages. For example, a semiconductor package including a single semiconductor element such as a diode, transistor, or a thyristor, and having a threaded, electrically and thermally conductive stud and a more or less flexible wire lead for at least two electrical connections to the semiconductor element may be formed in accordance with the teachings of this invention. Where such a device includes a relatively lower power gate lead or base lead, or the like, it may conveniently be combined with the tubing member hereinabove described. The invention also contemplates multi-semiconductor element packages of the type which are becoming increasingly widely employed for motor control applications and the like. These packages may include two or more semiconductor elements which may be diodes, thyristors, or the like, which are thermally connected to a single base. A plurality of electrical connections is made to the devices through the partition. Oftentimes other connections are made among the semiconductor elements which are completely enclosed by the chamber.

The features of the invention which are believed to be novel are pointed out with particularity in the appended claims. The invention itself, however, both as to its organization and method of operation, together with further objects and advantages thereof, may best be understood by reference to the following description taken in connection with the accompanying drawing in which:

Figure 1:
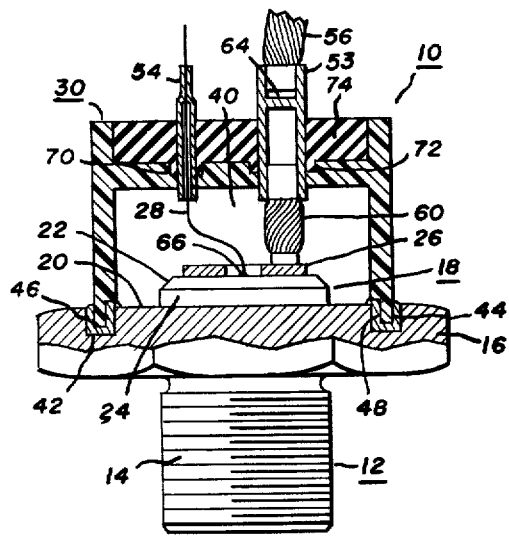
FIG. 1 is a section view of a semiconductor device in accordance with this invention.
Figure 2:
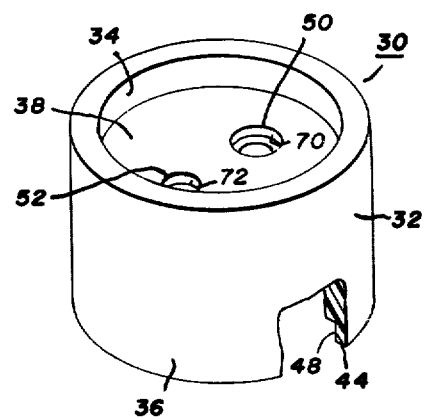
FIG. 2 is a view of an insulating housing for use in a semiconductor device in accordance with this invention.

FIGS. 1 and 2 illustrate an exemplary semiconductor package in accordance with this invention. The semiconductor package 10 includes a combination mounting and heatsinkable base member 12 which may conveniently be a single piece of copper having a threaded portion 14 and a semiconductor mounting pedestal portion 16 which is somewhat larger in diameter and is provided with a number of faces for tightening as with a wrench. Base 12 is preferably made of copper for good electrical conductivity and efficient heat removal from a semiconductor element. Where desired, materials such as steel or aluminum may be used as alternatives. A semiconductor subassembly 18 is mounted to face 20 of pedestal 16, for example, by soldering. Semiconductor subassembly 18 includes a semiconductor wafer 22 which is mounted to a backing plate 24 for relieving the stresses generated by thermal mismatch between semiconductor element 22 and pedestal 16. Typically, backing plate 24 may be made of tungsten, molybdenum, or a composite material having thermal expansion characteristics close to the semiconductor element such as structured copper. Backing plate 24 provides thermal and electrical contact to one major surface of semiconductor wafer 22. Electrical contact to the opposite surface of the semiconductor element is provided by washer 26 and flexible leads 28 and 60. Typically, washer 26 contacts the emitter cathode of a transistor or thyristor while lead 28 contacts the base or gate. Housing 30 which is illustrated both in FIGS. 1 and 2 encloses semiconductor subassembly 18. Referring specifically to FIG. 2, housing 30 may seem to include a cylindrical sleeve portion 32 having upper and lower open ends 34 and 36 and a partition 38 intermediate said open ends dividing sleeve portion 32 into upper and lower open cavities. As mounted to pedestal 16 of base 12, housing 30 encloses semiconductor subassembly 18 with chamber 40. Preferably, pedestal 16 of base 12 includes an annular recess 42 into which lower end 44 of housing 36 is inserted. An adhesive layer 46 bonds housing 30 to pedestal 16. Housing 30 and pedestal 16 cooperate to form chamber 40 which is hermetically sealed with respect to the ambient environment. As used in accordance with this invention, it will be understood that by hermetically sealed it is meant that the leak rate of chamber 40 is no more than about $10^{-8}$ cc/sec. in helium. In order to enhance the degree of sealing between housing 30 and base 12, the lower lip of housing 30 is provided with an annular groove 48 which results in a step-shaped cross section with consequent increased surface area exposed to the adhesive. While those skilled in the art will undoubtedly recognize that many different adhesives may be used, it has been found that EPO-TEK H77 adhesive manufactured by Epoxy Technology Corporation, Canton, Massachusetts, provides a seal which is in all respects satisfactory for use in this invention. Housing 30 may likewise be manufactured of a wide variety of materials without departing from the true spirit and scope of this invention. The requirements for housing 30 are that it have a sufficiently low permeability, that the ambient atmosphere will not contaminate the chamber 40, and that it have sufficient mechanical strength to survive the particular operating conditions to which the device will be subjected. Further, it should have a reasonably close thermal expansion characteristic to that of pedestal 16 to minimize the stress on the case when temperature cycling is encountered. In general, highly glass-filled plastics are preferred in accordance with this invention. Some examples of such plastics are PPS, polyphenoline sulfide, manufactured by Phillip's Chemical Corporation; GE polyester, manufactured by General Electric Company; and a number of phenolic materials manufactured by Durex Phenolic. Additionally, other more expensive materials may be used for especially demanding applications. For example, any one of a number of the electrically insulative ceramics which are oftentimes employed for semiconductor device packages may be employed. Alumina and beryllia are examples of high dielectric strength materials which may be usefully employed in accordance with the teachings of this invention. While the particular dielectric strength required for housing 30 will depend upon the voltage rating of the device, it is preferable that the material selected have a dielectric strength of between 400 and 500 volts per mil.

Housing 30 is provided with first and second openings 50 and 52 therein which accept electrical connecting means 53 and 54. Connecting means 53 may preferably be an electrically conductive sleeve as, for example, of copper adapted to receive an external flexible lead 56 into one end thereof which may be fastened by crimping, and to receive lead 60 into the opposite end. It is understood that leads 56 and 60 may in the alternative, or in addition to crimping, be soldered and/or welded or brazed, or the like. Sleeve 53 includes blocking partition 64 which prevents the two open ends 58 and 62 thereof from communicating chamber 40 with the outside ambient. Similarly, sleeve 54 accommodates gate lead 28 therein which may be electrically connected by crimping sleeve 54 in one or more places as will hereinbelow be further discussed.

It is a feature of this invention that sleeve 54 may serve the dual functions of providing an electrical contact to gate terminal 66 of semiconductor element 22 while also providing for the evacuation of chamber 40 and the backfilling thereof with an appropriate gas. In the alternative, two sleeves may be provided; a first sleeve having the sole function of providing electrical connections to the semiconductor element, and a second sleeve solely for evacuating and backfilling the sealed chamber of the device. Openings 50 and 52 through partition 38 are preferably provided with annular grooves 70 and 72 surrounding sleeves 54 and 52, respectively. These grooves enhance the seal between the two sleeves and housing 30 by sealing material 74 which is included within upper chamber 38 of housing 30. Sealant 74 may be selected from a wide variety of materials which provide the functions of sealing the interfaces between sleeves 53 and 54 and housing 30, as well as providing additional mechanical rigidity to the completed package. The material for sealant 74 should be selected to provide good thermal expansion compatibility with housing 30 and sleeves 53 and 54. Additionally, slight mechanical flexibility to both support sleeves 53 and 54 firmly and to be resistant to cracking during handling and operation is desirable. Conveniently, an epoxy adhesive such as is also used for sealing the lower end of housing 30 to pedestal 16 may be employed. It is desirable that sealant 74 have a relatively low viscosity to be pourable. For example, epoxy having a viscosity on the order of $10^4$ cps is advantageously employed.

It is a particular advantage of the semiconductor device of this invention that a package which is especially resistant to physical abuse during fabrication, handling, and operation, is provided. Sealant 74 provides both sealing and reinforcement of the mechanical connection between housing 30 and sleeves 53 and 54. Oftentimes, during assembly and subsequent thereto, large stresses are applied to the interface between housing 30 and sleeve 53. For example, the devices may be lifted by the leads. Reinforcement provided by sealant 74 permits these stresses to be sustained without damaging the device.

It is a feature of device 10 that mechanical stresses on semiconductor element 22 due to the package are substantially reduced over prior art devices of comparable strength. Specifically, there is no rigid mechanical connection between semiconductor element 22 and housing 30. Electrical connection is preferably made via flexible lead 60 rather than by a rigid member as has heretofore been the practice. This mechanical isolation of semiconductor element 22 from housing 30 is accomplished without any reduction in the rigidity of the housing. The physical strength of housing 30 is enhanced by the presence of sealant 74 within upper chamber 38 of the housing. Sleeves 53 and 54 are therefore especially firmly anchored to housing 30. This unique combination of mechanical isolation of the semiconductor element from the housing, and, the high physical strength of the housing itself provide important improvements in the operation of the device, especially during thermal cycling and handling.

Several of the advantages of a semiconductor package in accordance with the teachings of this invention are derived from the method of assembly thereof. Those skilled in the art will appreciate that during the assembly of plastic components, certain heating steps are required to cure the materials. For example, adhesives such as epoxies are preferably cured at a somewhat elevated temperature for deriving the best properties thereof. During such curing, gasses evolve from the cured materials and are harmful to certain semiconductor devices. Heretofore, where semiconductor elements have been directly encapsulated, that is, with encapsulating material in contact with the semiconductor element, these contaminants have come into contact with the semiconductor elements during operation and have tended to degrade the operation of the device as a whole. In accordance with the teachings of this invention, the evolution of such gasses from the materials employed during assembly and curing is followed by evacuation and/or purging of the sealed chamber 40 followed by refilling with a gas which is inert with respect to the semiconductor element, such as nitrogen. Thus the harmful effects of outgassing of contaminants from the plastics employed, as well as from the materials used to form the semiconductor subassembly itself, are largely eliminated. It is a feature of this invention that chamber 40 may conveniently be filled with a gas which enhances the stability of the semiconductor element therein. Although not specifically inert, nitrogen is inert with respect to most materials used to form semiconductor elements as, for example, silicon, germanium, and the III-V compounds. It is preferable in accordance with this invention that where compatible with the particular materials employed, any curing steps associated with the adhesives and sealants of this invention be performed at a temperature at least equal to the expected operating temperature of the device so that no further outgassing and consequent contamination of the device will occur during operation.

It is a feature of this invention that should failure of the semiconductor element occur, and further, should such failure involve fracturing or cracking as might occur during transient overload conditions, such failure will not directly affect the integrity of the package as a whole as would be expected if the package were in direct contact with the semiconductor device as is the case for solid encapsulated packages. That is to say, should any portion of semiconductor subassembly shatter, or the like, housing 30 and pedestal 16 will remain intact, thus minimizing any risk.

While it is currently perceived to be preferable to backfill chamber 40 with a gas at a pressure substantially equal to the ambient atmosphere in which the device will operate, those skilled in the art will recognize that certain specific applications may suggest that other techniques be employed. For example, it is within the scope of this invention to provide a vacuum within chamber 40 of a degree limited only by the selection of materials for housing 30, adhesive 46, sealing layer 74, and sleeves 52 and 54. Similarly, where it is of particular importance to prevent the introduction of even a slight amount of ambient atmosphere into chamber 40, a positive pressure within the chamber with respect to the atmosphere may be desirable. This, of course, will result in an even greater increase in pressure differential as the device is heated.

It is a feature of this invention that the operating characteristics of the semiconductor elements are enhanced by the package. Since the stress on semiconductor element 22 due to the package itself is substantially eliminated, the semiconductor element is especially insensitive to temperature cycleing. The stability of the blocking voltage characteristics of the device is particularly enhanced. The life of the device may be enhanced as well inasmuch as contaminants from the materials used to form the package have no path to reach the device itself.

Figure 3:
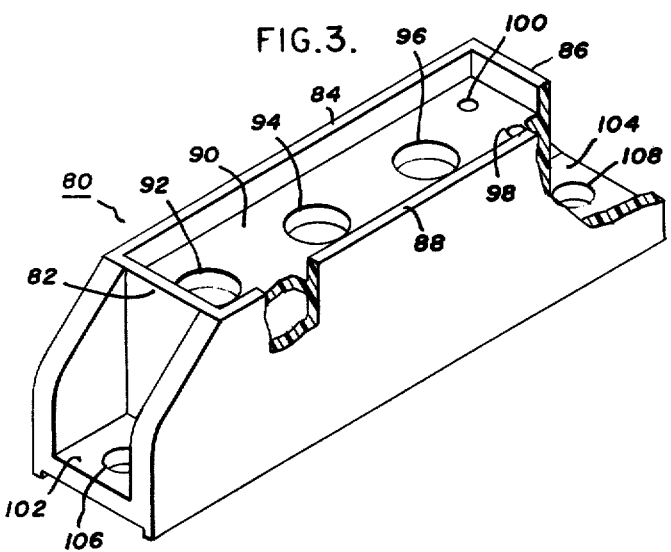
FIG. 3 is a view of an insulating housing for a multi-element semiconductor package in accordance with this invention.
Figure 4:
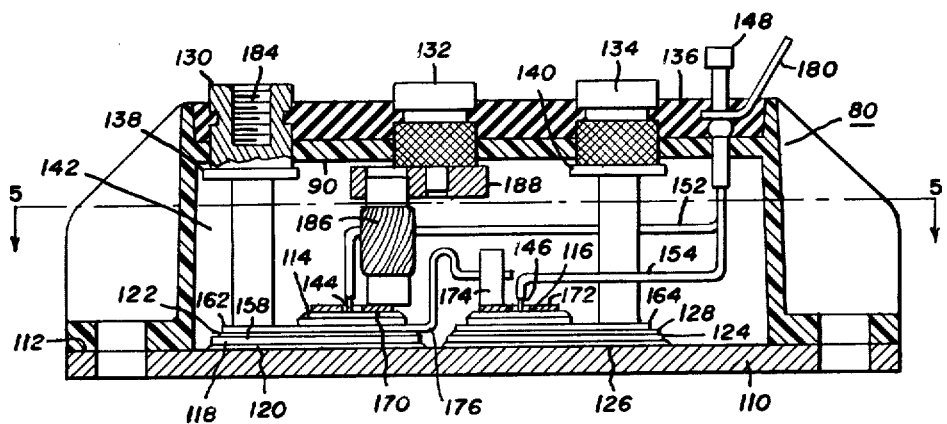
FIGS. 4 and 5 are views of a multi-element semiconductor device in accordance with this invention.
Figure 5:
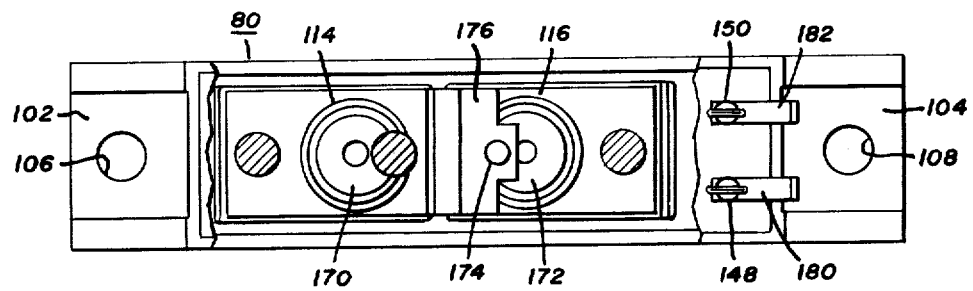

Referring now to FIGS. 3, 4, and 5, an alternative embodiment of this invention wherein multiple semiconductor elements are included within a single package is illustrated. FIG. 3 is a perspective view of an insulative housing 80 in accordance with this invention while FIGS. 4 and 5 are side and top views, respectively, of a semiconductor device including two semiconductor elements in a package which is capable of carrying substantial currents in accordance with this invention.

Referring to FIG. 3, housing 80 will be seen to be somewhat more complex than housing 30 of FIG. 1, but to include the same essential elements thereof. A rectangular sleeve portion is defined by vertical walls 82, 84, 86, and 88, and is divided into upper and lower cavities by partition 90. A plurality of openings 92, 94, 96, 98, and 100, are provided for the passage of electrical terminals therethrough. Housing 80 also includes mounting flanges 102 and 104 which will be seen to both provide surfaces for enhancing attachment to heatsinkable base 110 and also to provide means for mounting the device to an external heat exchanger. Holes 106 and 108 are provided in the flanges for this purpose.

The cooperation of housing 80 with the remaining components of multi-element semiconductor package may be seen by referring now to FIGS. 4 and 5. A heatsinkable base 110 is attached to housing 80 by an adhesive interface 112 which completely surrounds base 110. The particular adhesive selected to attach the housing to the heatsinkable base may be varied by those skilled in the art as long as the required characteristics of mechanical strength and hermeticity are met. The hereinabove mentioned adhesive EPO-TEK 77 has been found to provide satisfactory results. The semiconductor device of FIGS. 4 and 5 includes two semiconductor elements 114 and 116 which are electrically isolated from heatsinkable base 110 by insulative layers 118 and 124, respectively. Bonding layers 120 and 122 provide a low thermal impedance path between semiconductor element 114 and base 110. Bonding layers 126 and 128 perform similarly for element 116. Main current carrying conductive terminals 130, 132, and 134, provide high current carrying capacity electrical connection to the semiconductor elements. The material for these terminals may be selected by those skilled in the art according to the particular requirements of the device as long as they may be sealed with whatever material is selected for sealing layer 136. Nickel plated copper has been found to provide satisfactory results. Terminals 130 and 134 include enlarged annular regions 138 and 140 for both enhancing the sealing to partition 90 and for preventing any material from sealing layer 136 from entering chamber 142.

The particular internal connections to semiconductor elements 114 and 116 are not especially pertinent to the instant invention. A package according to the teachings hereof may house a wide variety of semiconductor elements as for example transistors, diodes, thyristors, and the like, in a wide variety of circuit relationships. These elements may or may not include base or gate terminals and may be either electrically connected to or isolated from base member 110. Two, three, or more high current carrying terminals may be required.

By way of example, only, therefore, the device of FIGS. 3 and 4 includes two thyristors 114 and 116, including gate electrodes 144 and 146 which are connected to gate sleeves 148 and 150 by leads 152 and 154. The thyristors include anode electrodes which are connected to electrical back-up plates 158 and 160 which are connected to terminals 130 and 134 by conductive layers 162 and 164, respectively. Connection to the cathode of the two devices is made by annular conductive washers 170 and 172 having center openings therein for the passage of connection to the gate electrodes. Connection between the cathode of semiconductor element 116 and the anode of element 114 is made by post 174 nd lead 176 which is an extension of layer 162. The devices are connected in series circuit relationship, the anode of element 116 being available at terminal 134; the cathode of element 114 being available at terminal 132; and the common connection being available at terminal 130.

Sleeves 148 and 150 are analogous to sleeve 54 of the device of FIGS. 1 and 2. The sleeves may serve the dual purpose of providing electrical connection to the gate electrodes of the devices and also for evacuating chamber 142 and refilling the same with a gas which is not detrimental to the semiconductor elements. Additionally, auxiliary terminals 180 and 182 may be connected to sleeves 148 and 150 for easier connection to external circuits as, for example, by soldering or push-on connectors. As illustrated, for example, in connection with terminal 130, a threaded portion 184 may conveniently be provided for attachment to an external conductor. Terminal 130, 132, and 134 are also preferably knurled for resisting twisting in sealant 136. The connection between terminal 130 and washer 170 is preferably made by flexible conductor 186 so that there is no rigid physical connection between housing 30 and either of the semiconductor elements. Flexible conductor 186 which may be a stranded wire conductor is connected to terminal 132 by intermediate plate 188 which provides the sealing function of rings 138 and 140 on terminals 130 and 138.

Sealing layer 136 is subject to the same considerations as heretofore discussed in conjunction with layer 74 of FIG. 2, and the same materials may be used therefore.

Figure 6:
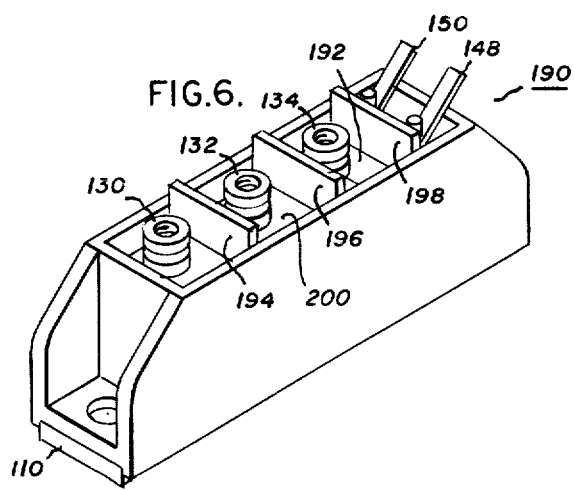
FIG. 6 is a view of a higher voltage embodiment of this invention.

An alternative embodiment of this invention especially adapted for high voltage applications is illustrated at FIG. 6. Inasmuch as the major portion of the high voltage embodiment of this invention is similar to that already described in conjunction with FIGS. 2-5, only the housing is shown.

Housing 190 includes upper chamber 192 which surrounds terminals 130, 132, 134, 148, and 150. The terminals are separated by dividers 194, 196, and 198, which form three separate chambers. Sealing layer 200 only partially fills the chambers so as to increase the length of the creep path between adjacent terminals. Preferably, the height of the dividers is greater than that of the terminals so that high voltage strike is prevented between adjacent terminals.

In accordance with another alternative embodiment of housing 190, dividers 194, 196, and 198 may provide for communication between the separate chambers so that the sealant will flow between them. It is preferable that the chamber enclosing gate terminals 148 and 150 be isolated and filled to a lower level and further that the terminals be shorter than the main current carrying terminals for better preventing strike or creep failure.

While this invention has been described in conjunction with two preferred embodiments thereof, those skilled in the art will recognize that many modifications and changes may be made without departing from the true spirit and scope of the invention. For example, both embodiments of this invention hereinabove described have utilized a single sleeve for providing both electrical connection to the gate terminal or terminals of the device and for evacuating the semiconductor element containing chamber. Those skilled in the art will recognize that it may be advantageous in some cases to provide physically distinct elements for these two functions, and it is contemplated, therefore, that a distinct evacuating and refilling tube may be employed. Additionally, although both embodiments of this invention so far described have included a single upper chamber in which all electrical connections to the semiconductor element or elements have been located and which chamber is sealed by a single layer of sealant, it may be desirable in some cases in order to increase the voltage handling characteristics of the device to provide two or more distinct chambers, each of which includes a sealing layer and one or more electrical terminals.

While the preferred embodiments of this invention have been illustrated with a heatsinkable base for connection to an external heatsink, it may be desirable in some cases to provide a base which is an integral part of a heat exchanger, or the like. For example, a device in accordance with this invention might be advantageously constructed on a base which is a portion of a wall of a tube through which a heat dissipating fluid may be passed. Alternatively, the devices may be fabricated on a finned heat exchanger for direct convection cooling to the ambient air.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. A hermetically sealed semiconductor package comprising:
   a heatsink member having a semiconductor element mounted thereto;
   an electrically insulative sleeve-shaped housing member mounted on said heat sink member and having a partition therein dividing said housing into upwardly and downwardly facing chambers, said downwardly facing chamber cooperating with said heat sink member to form a first closed chamber;
   electrical terminal means extending through said partition connected to said semiconductor element; and
   sealing means within said upwardly facing chamber in sealing relationship with said housing member and said electrical terminal means hermetically sealing said first closed chamber.

2. The package of claim 1 further comprising first and second mounting members extending outwardly from said sleeve in face-to-face mounting with like areas on said heat sink member.

3. The package of claim 2 comprising an adhesive layer joining said mounting members and said heat sink member.

4. The device of claim 1 comprising flexible electrical lead means connecting said electrical terminal means with said semiconductor element.

5. The device of claim 1 further comprising thermally conductive electrically insulating means disposed between said semiconductor element and said heat sink member.

6. The device of claim 1 further comprising a recessed portion of said heat sink member for receiving said housing member for enhancing the sealing relationship therewith.

7. The device of claim 1 wherein said sleeve shaped housing member comprises a substantially rigid electrically insulating housing member.

8. The device of claim 7 wherein said housing member comprises a plastic housing member.

9. The device of claim 8 wherein said housing member comprises a glass-filled-plastic housing member.

10. The device of claim 1 further comprising means for evacuating said first closed chamber and refilling said first chamber with an inert gas.

11. The device of claim 1 comprising an adhesive layer joining said housing member and said heat sink member.

12. The device of claim 11 wherein said adhesive layer comprises a layer of epoxy adhesive.

13. The device of claim 1 wherein said sealing means comprises a layer of epoxy adhesive material.

14. The device of claim 13 wherein said epoxy comprises an epoxy having a viscosity of about $10^4$ Cps.

15. The device of claim 1 further comprising barrier means dividing said upwardly facing chamber into first and second portions, electrical terminal means in each of said portions and sealing means within each of said portions, said barrier means extending above the top level of said sealing means.

* * * * *